(12) United States Patent
Kushnarenko et al.

(10) Patent No.: US 8,995,201 B1
(45) Date of Patent: Mar. 31, 2015

(54) METHODS CIRCUITS APPARATUSES AND SYSTEMS FOR SENSING A LOGICAL STATE OF A NON-VOLATILE MEMORY CELL AND NON-VOLATILE MEMORY DEVICES PRODUCED ACCORDINGLY

(71) Applicant: Spansion LLC, Sunnyvale, CA (US)

(72) Inventors: Alexander Kushnarenko, Haifa (IL); Yoram Betser, Mazkeret-Batya (IL)

(73) Assignee: Spansion LLC, Sunnyvale, CA (US)

(*) Notice: Subject to any disclaimer, the term of this patent is extended or adjusted under 35 U.S.C. 154(b) by 0 days.

(21) Appl. No.: 14/073,914

(22) Filed: Nov. 7, 2013

(51) Int. Cl.
*G11C 16/06* (2006.01)
*G11C 16/28* (2006.01)

(52) U.S. Cl.
CPC ............................. *G11C 16/28* (2013.01)
USPC ................... 365/185.21; 365/205; 365/207

(58) Field of Classification Search
USPC .................... 365/185.21, 205, 207
See application file for complete search history.

(56) References Cited

U.S. PATENT DOCUMENTS 7,881,119 B2 * 2/2011 Fukushima .............. 365/185.21

* cited by examiner

*Primary Examiner* — David Lam
(74) *Attorney, Agent, or Firm* — Vladimir Sherman; Professional Patent Solutions

(57) ABSTRACT

Disclose is a non-volatile memory (NVM) cell sensing circuit. The sensing circuit may include a sense-side-line conditioning circuit segment adapted to condition a sense-side-line of the NVM cell. Conditioning may include adjusting a charge density within the NVM cell sense-side-line during a first NVM cell current sensing phase. The conditioning circuit segment may also be adapted to maintain an NVM cell current sensing condition during a second NVM cell current sensing phase. Adjusting a charge density within the NVM cell sense-side-line may include inducing current in the sense-side-line in a direction opposite to the sensing current.

27 Claims, 11 Drawing Sheets

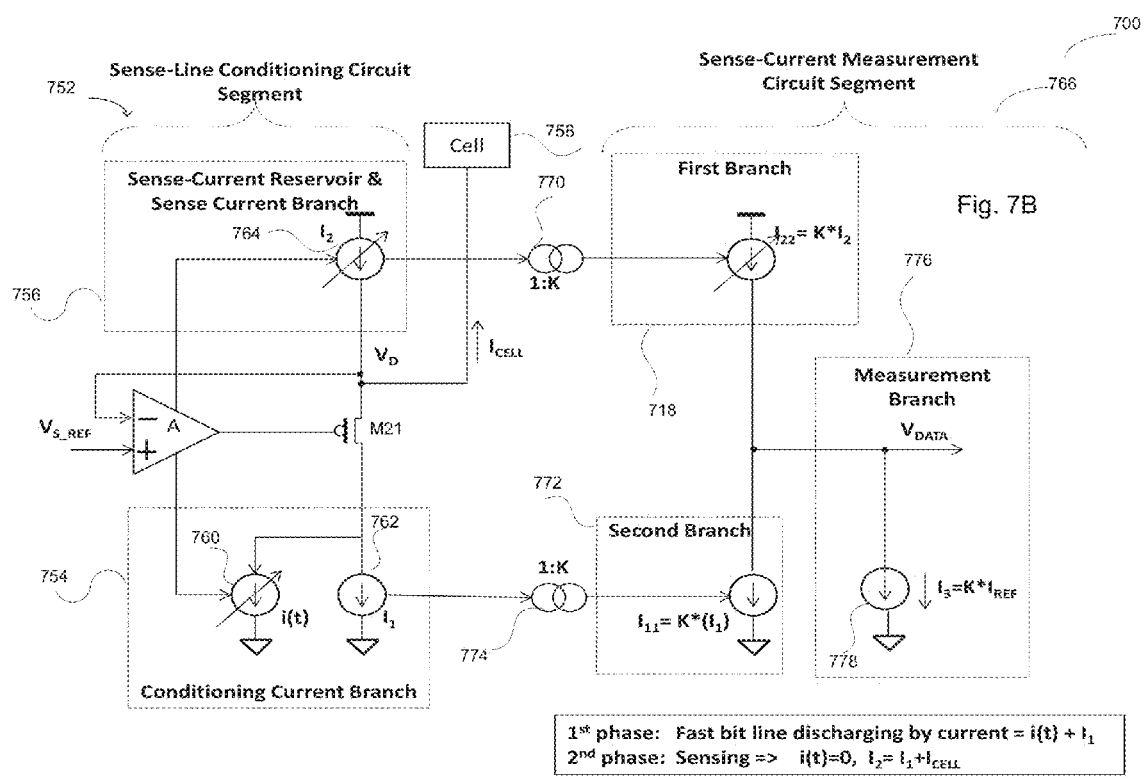

METHODS CIRCUITS APPARATUSES AND SYSTEMS FOR SENSING A LOGICAL STATE OF A NON-VOLATILE MEMORY CELL AND NON-VOLATILE MEMORY DEVICES PRODUCED ACCORDINGLY

FIELD OF THE INVENTION

The present invention relates generally to the field of semiconductors. More specifically, the present invention relates to methods, circuits, apparatuses and systems for sensing a logical state a non-volatile memory cell and to non-volatile memory devices produced accordingly.

BACKGROUND

Non-volatile memory ("NVM") cells are fabricated in a large variety of structures, including but not limited to: (1) poly-silicon floating gate, (2) MirrorBit®, (3) Silicon-Oxide-Nitride-Oxide-Silicon ("SONOS") and others. FIGS. 1A through 1C show cross-sectional views of several different NVM cell structures. Although each NVM cell structure has unique properties and operating characteristics, basic operation of NMV cells, sets or arrays of NVM cells, and devices based on these NVM cells may be considered similar. NVM cells are programmed (i.e. charged or discharged) to a logical state correlated with information (e.g. bits) they are to store. NVM cells may be read by detecting their threshold voltages (Vt).

Information may be stored on NVM cells by regulating and altering the NVM cell's logical state, which logical state may be defined and determined by adjusting and later reading its Vt, where Vt is usually defined as the gate to source voltage required to allow the NVM cell to begin conducting non-negligible current through its drain to source channel. Different threshold voltage ranges are associated with different logical states, and a NVM cell's threshold voltage level may be correlated to the amount of charge (e.g. electrons) stored in a charge storage region of the cell, FIG. 2A shows a voltage distribution graph depicting possible threshold voltage distributions of a binary non-volatile memory cell, wherein vertical lines depict boundary voltage values correlated with each of the cell's possible states. Cells having Vt lower than EV level are said to be erased verified. Cells having Vt higher than PV are said to be program verified. Since NVM cells may lose some amounts of stored charge, a read verify level above which the cell is also considered programmed, may be set below a program verify level. A Program sequence of programming pulses may be used to drive the Vt of a cell higher than PV, while an erase sequence may drive the cell's Vt lower than EV.

FIG. 2B shows a voltage distribution graph depicting possible threshold voltage distributions in the charge storage region of a multi-level non-volatile memory cell ("MLC"), wherein one set of vertical lines depict boundary values correlated with each of the cell's possible Program Verify Threshold Voltages (PV00, PV01, etc.), another set of vertical lines depict boundary values correlated with the Read Verify level of each of the cell's possible Program states (RV00, RV01, etc.), and yet another set depict boundary lines for Intermediate Program Verify voltages (PVI 00, PVI 01, etc.) associated with each of the states.

The amount of charge stored in a charge storage region of an NVM cell, may be increased by applying one or more programming pulses to the cell. While the amount of charge in the cell may decrease by applying an erase pulse to the NVM cell which may force the charge reduction in the cell's charge storage region, and consequently may decrease the NVM's Vt.

Most methods of operating NVM cells (e.g. programming, reading, and erasing) require one or more reference structures, such as reference cells, to generate the reference levels against which the Vt of a cell is compared. Each of the one or more reference structures may be compared against a memory cell being operated in order to determine a Vt, condition or state of the memory cell being operated. Generally, in order to determine whether an NVM cell is at a specific state, for example erased, programmed, or programmed at one of multiple possible program states within a multi-level cell ("MLC"), the cell's threshold level is compared to that of a reference structure whose threshold level is preset and known to be at a voltage level associated with the specific state being tested for.

Comparing the threshold voltage of an NVM cell to that of a reference cell is often accomplished using a sense amplifier or other NVM cell current sensing circuit. Various techniques for comparing an NVM's threshold voltage against those of one or more reference cells, in order to determine the state(s) of the NVM's cells, are known. The most common technique includes applying the same terminal voltages and supply currents to the NVM being read and to a defined reference structure (e.g. reference cell having a known Vt) and determining which starts conduct channel/cell current first. FIG. 3 shows a functional block diagram of an NVM device including: (1) an array of NVM cell; (2) a set of reference structures, which structures could be from within the array; (3) one or more voltage sources for applying voltages and providing current to both the NVM cells and array structures; and (4) cell evaluation circuits(s) such as sense amps. FIG. 4 shows a composite circuit and current flow diagram depicting how applied voltages and currents may induce current flow through individually selected NVM cells within an NVM array during a reading/sensing phase. FIG. 5 shows a composite circuit and current flow diagram depicting how applied voltages and currents on lines of an NVM array may induce: (1) current flow through an Individually selected NVM cell, and (2) lateral or pipe current through several NVM cells adjacent to the selected cell. FIG. 5 further shows how a sense amplifier sensing the selected NVM cell may compensate for lateral pipe current by having the bit lines of the adjacent cells switched into the current collection/sensing path of the sense amplifier.

SUMMARY OF THE INVENTION

The present invention may include methods, circuits, apparatuses and systems for sensing a logical state a non-volatile memory ("NVM") cell, and further includes non-volatile memory circuits and devices produced accordingly. According to some embodiments, there may be provided an NVM cell sensing circuit, also referable to as a sense amplifier, which may include a sense-line conditioning circuit segment adapted to adjust a charge density, by increasing or decreasing charge, within a sense-line or sense-side-line connected to an NVM cell whose threshold voltage (Vt) is to be sensed. The term sense-line or sense-side-line generally means the electrically conducting (bit) line connected to an NVM cell terminal, either source terminal or drain terminal, from which the NVM cell (channel) current is sensed and/or measured as part of determining the cell's Vt. Accordingly, a junction of the conditioning circuit segment may be connected through an electrical switch (e.g. Y-MUX) to the sense-side-line of an NVM cell to be sensed. The sense-line conditioning circuit segment may be adapted to either charge or discharge electrons from the sense-side-line of the NVM cell, by either pushing or pulling electrical current to or from the sense-side-line. According to embodiments where the sensing circuit is operating according to a source-side sensing arrangement, the conditioning circuit segment may perform charging of the sense-side-line by pushing current into the sense-side-line. According to embodiments where the sensing circuit is operating according to a drain-side sensing arrangement, the conditioning circuit segment may perform discharging of the sense-side-line by pulling current from the sense-side-line.

According to embodiments, either before or concurrent with a sensing current being induced through an NVM cell to be sensed, the sense-line conditioning circuit segment may condition the sense-side line for sensing by adjusting the sense-side-line charge density of the NVM cell, for example to or near a start-of-sensing-charge-density. Sense-side-line conditioning related charge density adjustment of the sense-side-line may be performed by the conditioning circuit segment which may induce current flow either into or out of the NVM cell sense-side-line. The direction of the conditioning current may be in a direction opposite to the NVM cell's sensing current. Shortly before or after an NVM cell's sensing current reaches a steady-state flow, level or value, the conditioning circuit segment may cease to adjust charge density within the sense-side-line. Shortly before or after an NVM cell's sensing current reaches a steady-state flow, level or value, the sense-line conditioning circuit segment may operate to maintain a sensing-condition for NVM cell sensing current to keep flowing. Maintaining a sensing-condition may include fixing and/or maintaining a voltage at a termination point of the sense-side-line of the NVM cell such that voltages across various terminal sets of the NVM cell are maintained stable and the NVM cell sensing current is maintained at a steady state.

The NVM sense-line conditioning circuit segment may include a conditioning-current branch adapted to either provide or drain conditioning current intended to adjust the charge density of a sense-side-line connected to an NVM cell to be sensed. According to some source-side sensing embodiments, the conditioning-current branch may include one or more current sources, one of which may be a controllable or adjustable current source. According to some drain-side sensing embodiments, the conditioning-current branch may include one or more current sinks, one of which may be a controllable or adjustable current sink. According to some embodiments, during a first phase of sensing, when the sense-side-line of the NVM is being conditioned for sensing, current levels either sourced or sunk by the conditioning-current branch may be greater than current levels sourced or sunk after the NVM cell sensing current has reached a steady state.

During the first phase, current levels generated by the conditioning current branch may be either static or dynamic. After the sensing current has reached a steady state, the current levels generated by the conditioning current branch may be substantially static or substantially fixed. The substantially static or substantially fixed current produced by the conditioning current branch at steady state may be termed a condition sustaining current or a biasing current. The condition sustaining current or biasing current (herein after collectively "biasing current") may serve to fix or maintain a voltage level at a point of the sense-side-line, for example at the termination point. The biasing current, for example, may bias a field effect transistor of the sense-line conditioning circuit segment, which transistor may have: (1) a source terminal connected to the sense-line termination point, and (2) a gate terminal connected to a fixed voltage point—thereby substantially fixing the voltage at the sense-side-line termination point. According to such embodiments, the transistor may be termed a voltage anchor which voltage anchor assists in maintaining conditions for steady state sensing current flow.

The NVM cell sense-line conditioning circuit segment may include a sense-current-reservoir adapted to either provide or to receive an NVM cell's sensing current. The sense current reservoir may include a sense current branch through which substantially all of an NVM cell's sensing current, along with other currents such as a biasing current, may flow. According to some source-side sensing embodiments, the sense-current-reservoir branch may include a current sink into which sensing current from an NVM cell being sensed may be sunk or drained. According to some drain-side sensing embodiments, the sense-current-reservoir may include a current source which may provide sensing current leading into the NVM cell being sensed.

According to embodiments, the reservoir current source or sink (source/sink) may be controllable or adjustable. During the first phase of sensing, while conditioning of the sense-side-line is being performed, the reservoir source/sink may be caused to pinch (i.e. reduce or substantially block) current flow through the reservoir. During the second phase, while NVM cell current is in steady state, the reservoir source/sink may be released such that the amount of current flowing through the reservoir source/sink is substantially a function of (e.g. the sum), or dictated by: (1) the NVM cell sensing current, and (2) biasing current produced by the conditioning current branch.

The NVM Cell sensing circuit may also include a sense-current-measurement circuit segment including a first branch which may be at least partially coupled, via a current mirroring arrangement, with at least the sense current branch (e.g. reservoir source/sink) of the sense-current-reservoir. According to further embodiments, a second branch of the sense-current-measurement circuit segment may be at least partially coupled, via a current mirroring arrangement, to the conditioning-current branch of the sense-line conditioning circuit segment. The sense-current-measurement circuit segment may also include a measurement branch connected to an interconnect junction between the first and second branches, such that a current induced to flow through the measurement branch is substantially equal to a difference between the current flowing through the first branch and the current flowing through the second branch.

According to embodiments, the sense-current-measurement circuit segment is referenced or utilized during a second sensing stage, once the NVM cell sensing current has reached a steady state and the conditioning current branch is only generating a biasing current. At this second sensing stage, since the current flowing through the first branch is directly related to the current flowing through the sense current reservoir sense branch current branch (i.e. the sum of the NVM cell sensing current and the biasing current), and the current flowing through the second branch is directly related to the current flowing through the conditioning current branch (i.e. the biasing current), the current induced in the measurement branch may be directly related to, some ratio (e.g. 1:1) of, the NVM cell sensing current at steady state. With knowledge of the respective ratios of the current mirroring arrangements relating to the first and second branches, a ratio between the NVM cell current and the measurement branch current is derivable. According to the simplest embodiments, both current mirror ratios are 1:1 and the measurement branch current will be substantially equal to the NVM cell current. Therefore, by measuring current flowing through the measurement branch, via direct measurement or indirect measurement (e.g.

through a load), an estimate of a current flowing through the NVM cell may be provided. During operation of the NVM cell sensing circuit, once the NVM sense current has reached or is approaching steady state, a Vt and thus a logical state of the NVM cell may be determined or estimated by comparing the measurement branch current against one or more reference currents or voltages.

According to some embodiments, there is provided a regulator circuit adapted to coordinate operation of some or all of the various circuit segments, relative to one another and relative to circuitry providing and switching current to one or more NVM cells of an NVM array.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 5 further shows how a sense amplifier sensing the selected NVM cell may compensate for lateral/pipe current by having the bit lines of the adjacent cells switched into the current collection/ sensing path of the sense amplifier;

FIGS. 7A and 7B are composite functional block and circuit diagrams of NVM Cell current sensing circuits (e.g. sense amplifiers) operative according to drain-side sensing embodiments of the present invention;

Figure 1A:
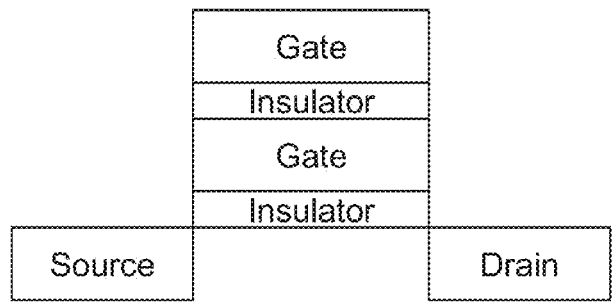
FIGS. 1A through 1C show cross-sectional views of three different NVM cell structures.
Figure 1B:
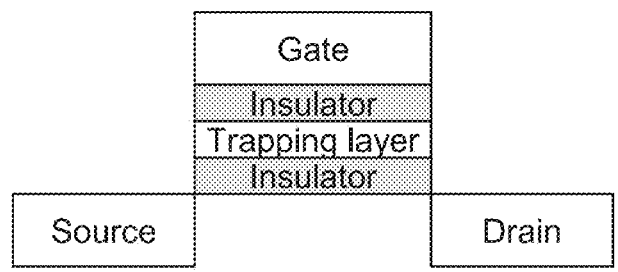
Figure 1C:
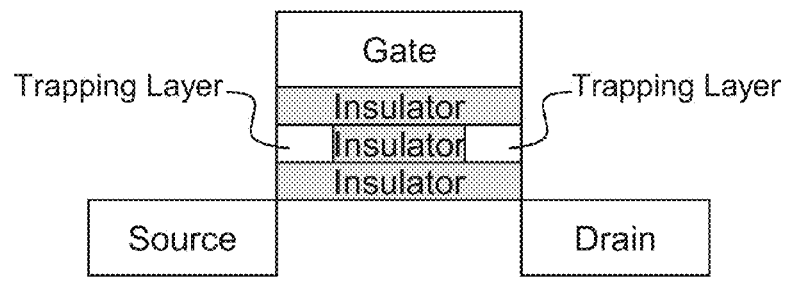
Figure 2A:
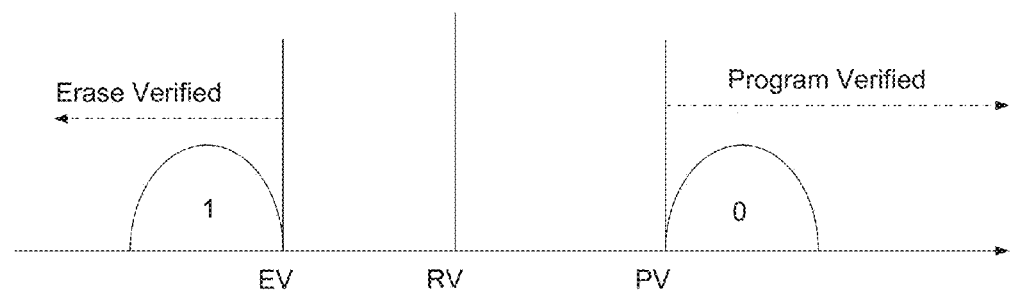
FIG. 2A shows a voltage distribution graph depicting possible threshold voltage distributions of a binary non-volatile memory cell, wherein vertical lines depict boundary voltage values correlated with each of the cell's possible states.
Figure 2B:
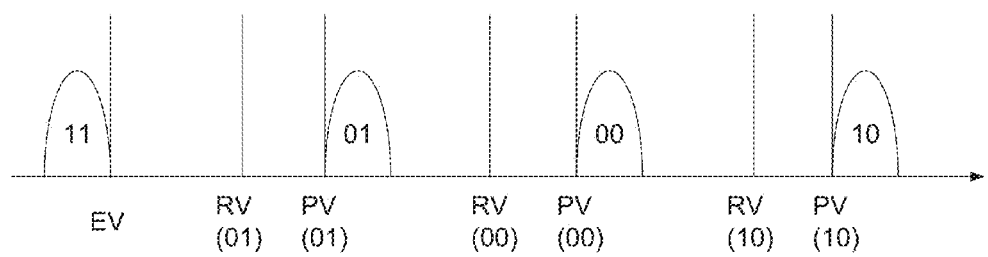
FIG. 2B shows a voltage distribution graph depicting possible threshold voltage distributions in the charge storage region of a multi-level non-volatile memory cell ("MLC"), wherein one set of vertical lines depict boundary values correlated with each of the cell's possible Program Verify Threshold Voltages (PV00, PV01, etc.), another set of vertical lines depict boundary values correlated with the Read Verify level of each of the cell's possible Program states (RV00, RV01, etc.), and yet another set depict boundary lines for Intermediate Program Verify voltages (PVI 00, PVI 01, etc) associated with each of the states.
Figure 3:
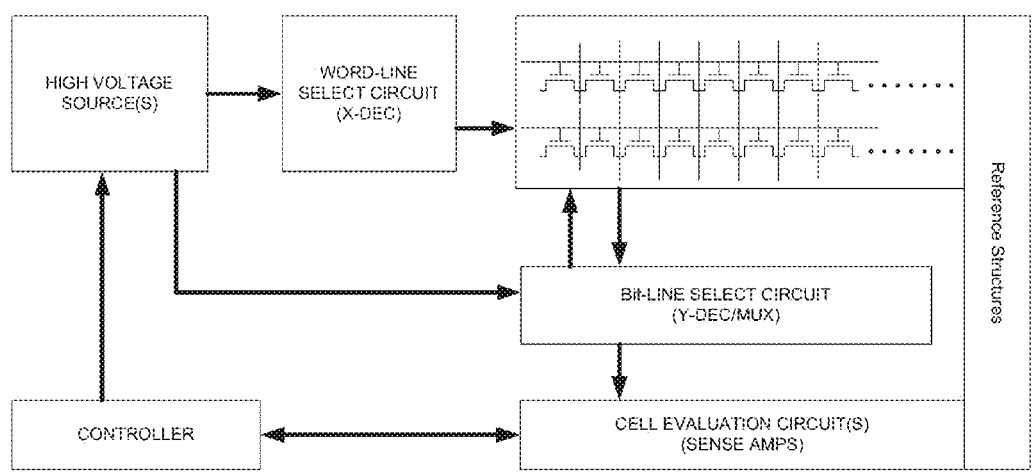
FIG. 3 shows a functional block diagram of an NVM device including: (1) an array of NVM cell; (2) a set of reference structures, which structures could be from within the array; (3) one or more voltage sources for applying voltages and providing current to both the NVM cells and array structures; and (4) cell evaluation circuits(s) such as sense amps.
Figure 4:
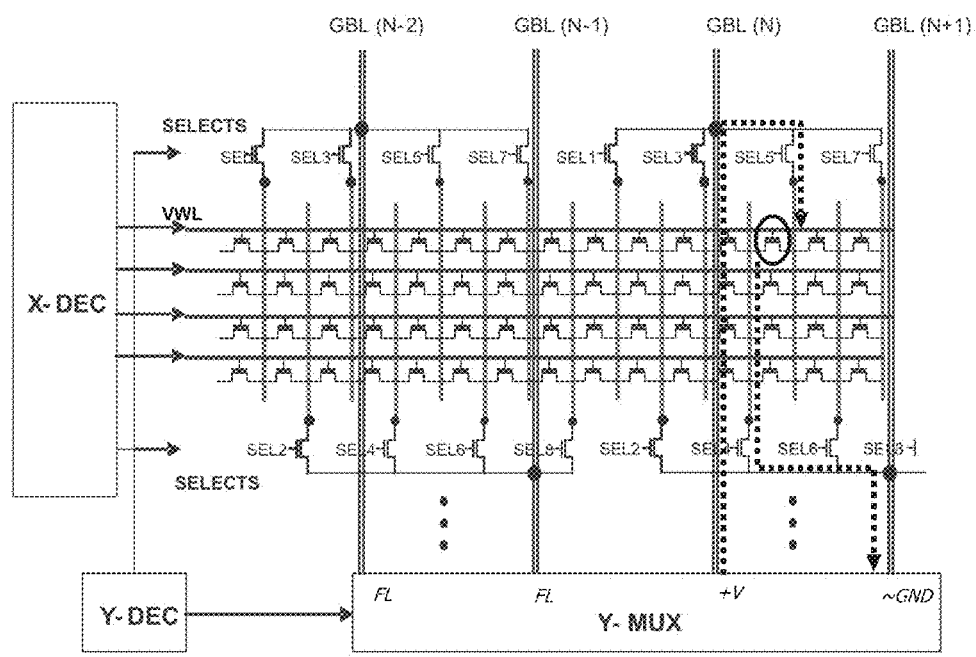
FIG. 4 shows a composite circuit and current flow diagram depicting how applied voltages and currents on lines of an NVM array may ideally induce current flow through individually selected NVM cells within an NVM array during a reading/sensing phase.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION in the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing" "computing" "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

In the following description where a source side sensing scheme is discussed by way of example is interchangeable with a drain side sending scheme (with the appropriate modifications being made where necessary). Furthermore, due to the symmetrical architecture of the memory cell, each node of the cell (drain and source) are interchangeable and may be marked as a drain or a source depending on the address selected for access. According to some embodiments, a non-volatile memory (NVM) cell sensing circuit may include a sense-side-line conditioning circuit segment to condition a sense-side-line of the NVM cell by adjusting a charge density within the NVM cell sense-side-line during a first NVM cell current sensing phase and further to maintain an NVM cell current sensing condition during a second NVM cell current sensing phase. Adjusting a charge density within the NVM cell sense-side-line may include inducing current in the sense-side-line in a direction opposite to the sensing current.

Furthermore, according to some embodiments, the sense-side-line conditioning circuit segment comprises a condition current branch to generate a first current during the first sensing phase and a second current, smaller than the first current, during the second sensing phase. The conditioning current branch may include one or more current sources when said sensing circuit is operating according to a source-side sensing arrangement. The conditioning current branch may include one or more current sinks when said sensing circuit is operating according to a drain-side sensing arrangement. The sense-side-line conditioning circuit segment may include a sense-current reservoir to pinch off current flow during the first current sensing phase and to provide for substantially uninhibited flow of NVM cell current during the second current sensing phase. The current reservoir may include a controllable current sink when the sensing circuit is operating according to a source-side sensing arrangement. The current reservoir may include a controllable current source when the sensing circuit is operating according to a drain-side sensing arrangement. The sensing circuit may also include a sense current measurement circuit to induce within a constituent branch a current whose amplitude is directly related the NVM cell current. The sense current measurement circuit may include two mirroring circuit branches, each of which may be coupled in a current mirroring arrangement with a corresponding branch of the sense-side-line conditioning circuit segment.

According to some embodiments, a non-volatile memory (NVM) device may include a non-volatile memory array including a set of NVM cells and a sense-side-line conditioning circuit segment to condition a sense-side-line of an NVM cell by adjusting a charge density within the NVM cell sense-side-line during a first NVM cell current sensing phase and further to maintain an NVM cell current sensing condition during a second NVM cell current sensing phase. The adjusting of a charge density within the NVM Cell sense-side-line may include inducing current in the sense-side-line in a direction opposite to the sensing current.

According to some embodiments, a non-volatile memory (NVM) cell sensing method may include: conditioning a sense-side-line of the NVM cell by adjusting a charge density within the NVM cell sense-side-line during a first NVM cell current sensing phase, maintaining an NVM cell current sensing condition during a second NVM cell current sensing phase. Adjusting a charge density within the NVM cell sense-side-line may include inducing current in the sense-side-line in a direction opposite to the sensing current.

Figure 6A:
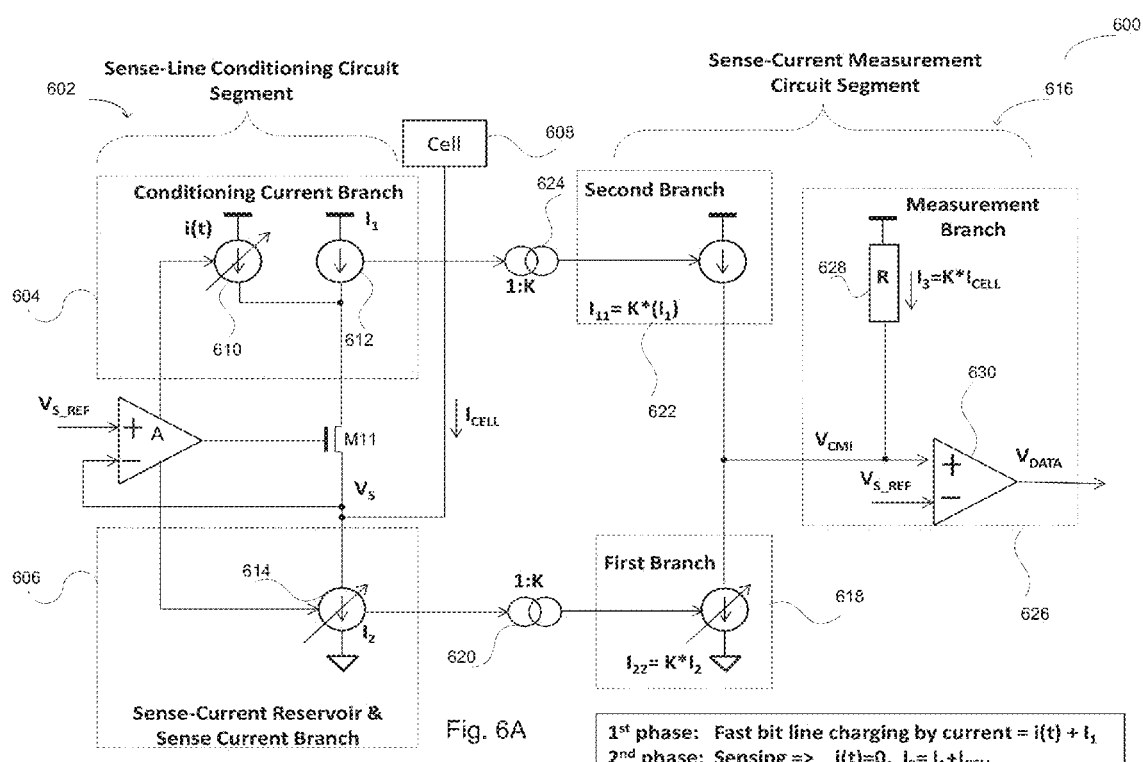
FIGS. 6A and 6B are composite functional block and circuit diagrams of NVM cell current sensing circuits (e.g. sense amplifiers) operative according to source-side sensing embodiments of the present invention.

Turning now to FIG. 6A depicted is a composite functional block and circuit diagrams of NVM cell current sensing circuits 600 operative according to example source-side sensing embodiments of the present invention, NVM cell current sensing circuits 600 may include a sense line conditioning circuit segment 602 which may include a conditioning current branch 604 and a sense current reservoir and sense current branch 606 and more. According to some embodiments, sense line conditioning circuit segment 602 may be adapted to adjust a charge density, by increasing or decreasing charge, within a sense-line or sense-side-line connected to an NVM cell 608 whose threshold voltage (Vt) is to be sensed. Accordingly, a junction of the conditioning circuit segment 602 may be connected through an electrical switch (e.g. Y-MUX) to the sense-side-line of NVM cell 608 to be sensed. Conditioning circuit segment 602 may perform charging of the sense-side-line by pushing current into the sense-side-line.

According to some embodiments, either before or concurrent with a sensing current being induced through NVM cell 608, sense-line conditioning circuit segment 602 may condition the sense-side line for sensing by adjusting the sense-side-line charge density of the NVM cell, for example to or near a start-of-sensing-charge-density. Sense-side-line conditioning related charge density adjustment of the sense-side-line may be performed by conditioning circuit segment 602 which may induce current flow either into or out of the NVM cell sense-side-line. The direction of the conditioning current may be in a direction opposite to the NVM cell's sensing current. Shortly before or after NVM cell's 608 sensing current reaches a steady-state flow, level or value, conditioning circuit segment 602 may cease to adjust charge density within the sense-side-line. Shortly before or after NVM cell's 608 sensing current reaches a steady-state flow, level or value, the sense-line conditioning circuit segment may operate to maintain a sensing-condition for NVM cell sensing current to keep flowing. Maintaining a sensing-condition may include fixing and/or maintaining a voltage at a termination point of the sense-side-line of the NVM Cell such that voltages across various terminal sets of the NVM cell are maintained stable and the NVM cell sensing current is maintained at a steady state.

According to some embodiments, conditioning-current branch 604 may be adapted to either provide or drain conditioning current intended to adjust the charge density of a sense-side-line connected to NVM cell 608, where NVM cell 608 is intended to be sensed. Conditioning-current branch 604 may include one or more current sources, one of which may be a controllable or adjustable current source 610. According to some embodiments, during a first phase of sensing, when the sense-side-line of the NVM is being conditioned for sensing, current levels sourced by conditioning-current branch 604 may be greater than current levels sourced after the NVM cell 608 sensing current has reached a steady state.

According to some embodiments, during a first phase, current levels generated by conditioning current branch 604 may be either static or dynamic. After the sensing current has reached a steady state, the current levels generated by conditioning current branch 610 may be substantially static or substantially fixed as depicted by biasing current source 612. The substantially static or substantially fixed current produced by conditioning current branch 604, via biasing current source 612, at steady state may be termed a condition sustaining current or a biasing current. The condition sustaining current or biasing current (herein after collectively "biasing current") may serve to fix or maintain a voltage level at a point of the sense-side-line, for example at the termination point $V_s$. The biasing current, for example, may bias a field effect transistor M11 of the sense-line conditioning circuit segment, which transistor M11 may have: (1) a source terminal connected to the sense-line termination point $V_s$, and (2) a gate terminal connected to a fixed voltage point—thereby substantially fixing the voltage at the sense-side-line termination point. According to such embodiments, the transistor M11 may be termed a voltage anchor which voltage anchor assists in maintaining conditions for steady state sensing current flow.

According to some embodiments, NVM cell sense-line conditioning circuit segment 602 may include a sense-current-reservoir 606 adapted to provide/receive NVM cell's 608 sensing current. Sense current reservoir 606 may include a sense current branch through which substantially all of an NVM cell's sensing current, along with other currents such as a biasing current, may flow. According to some source-side sensing embodiments, the sense-current-reservoir branch may include current sink 614 into which sensing current from NVM cell 608 being sensed may be sunk or drained.

According to embodiments, reservoir current sink 614 may be controllable or adjustable. For example, during the first phase of sensing, while conditioning of the sense-side-line is being performed, reservoir sink 614 may be caused to pinch (i.e. reduce or substantially block) current flow through the reservoir. During the second phase, while NVM cell current is in steady state, reservoir sink 614 may be released such that the amount of current flowing through reservoir sink 614 is substantially a function of (e.g. the sum), or dictated by: (1) the NVM cell 608 sensing current, and (2) biasing current produced by conditioning current branch 604.

NVM cell sensing circuit 600 may also include sense-current-measurement circuit segment 616 including first branch 618 which may be at least partially coupled, via current mirroring arrangement 620, with at least sense current branch 606 (e.g. reservoir sink 614).

According to further embodiments, second branch 620 of sense-current-measurement circuit segment 616 may be at least partially coupled, via current mirroring arrangement 624, to conditioning-current branch 604 of sense-line conditioning circuit segment 602. Sense-current-measurement circuit segment 616 may also include measurement branch 626 connected to an interconnect junction between first and second branches (618 and 622), such that a current induced to flow through measurement branch 626 is substantially equal to a difference between the current flowing through first branch 618 and the current flowing through second branch 622.

According to embodiments, sense-current-measurement circuit segment 616 may be referenced or utilized during a second sensing stage, once the NVM cell 608 sensing current has reached a steady state and conditioning current branch 604 is only generating a biasing current. At this, example, second sensing stage, since the current flowing through first branch 618 may be directly related to the current flowing through sense current reservoir sense branch current branch 606 (i.e. the sum of the NVM cell 608 sensing current and the biasing current), and the current flowing through second branch 622 is directly related to the current flowing through conditioning current branch 604 (Le, the biasing current), the current induced in measurement branch 626 may be directly related to, some ratio (e.g. 1:1) of, the NVM cell 608 sensing current at steady state. With knowledge of the respective ratios of the current mirroring arrangements relating to first and second branches (618 and 622), a ratio between the NVM cell 608 current and measurement branch 626 current is derivable. According to the simplest embodiments, both current mirror ratios are 1:1 and the measurement branch current will be substantially equal to the NVM cell 608 current. Therefore, by measuring current flowing through measurement branch 626, via direct measurement or indirect measurement (e.g. through load 628), an estimate of a current flowing through NVM cell 608 may be provided. During operation of NVM cell sensing circuit 600, once the NVM sense current has reached or is approaching steady state, a Vt and thus a logical state of NVM cell 608 may be determined or estimated by comparing measurement branch 626 current against one or more reference currents or voltages (such as $V_{s\_ref}$). For the purpose of carrying out the discussed comparison a comparator 630 may be used.

Figure 6B:
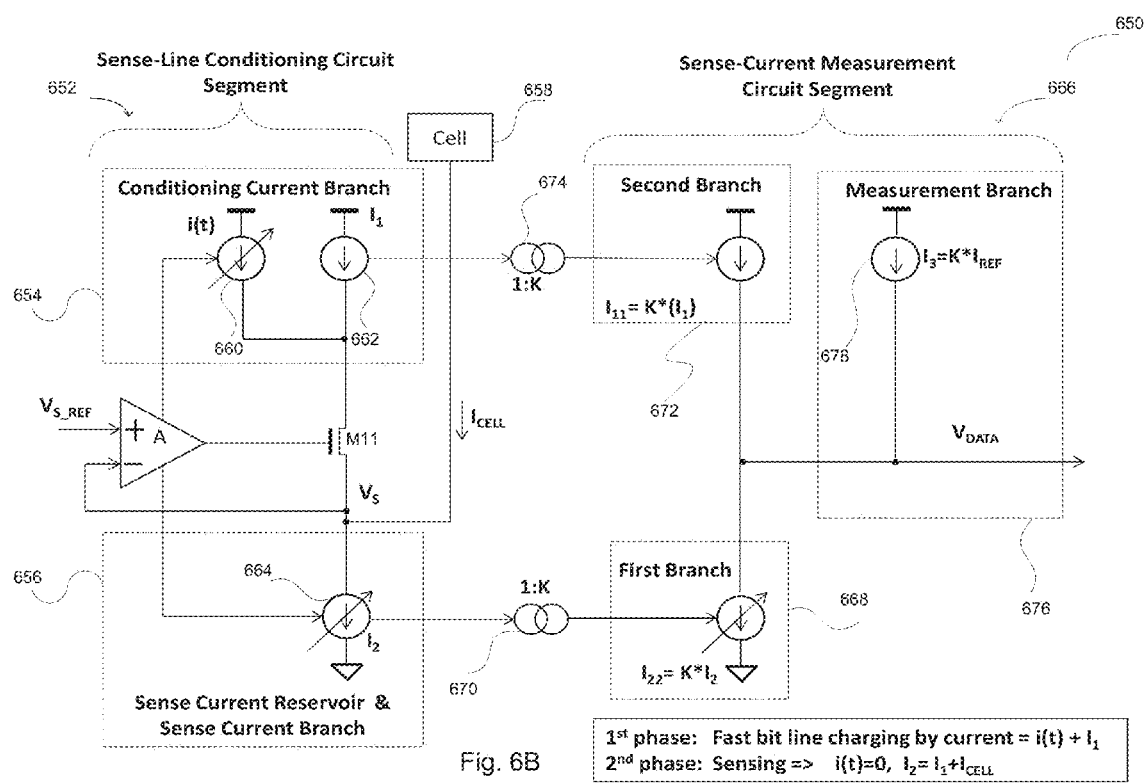

Turning now to FIG. 6B depicted is a composite functional block and circuit diagrams of NVM cell current sensing circuits 650 operative according to example source-side sensing embodiments of the present invention. It is understood that NVM cell sensing circuits 650 is substantially similar to NVM cell sensing circuits 600 and that elements 652-676 are substantially similar to elements 602-626 of FIG. 6A. With regard to measurement branch 676, depicted is measuring current flowing through measurement branch 676, via direct measurement so that an estimate of a current flowing through NVM cell 658 may be provided. For example, the difference in current between the first and second branch (668 and 674 respectively) may be $I=I_{22}-I_{11}$; if $I_{11}=K*I_1$ and $I_{22}=K*I_2=K*I_1+K*I_{CELL}$ then $I=K*I_{CELL}$. Accordingly, $V_{DATA}$ may rise if the reference current $I_3=K*I_{REF}$ is higher than measured cell current ($I=K*I_{CELL}$) and goes may descend if reference current $I_3=K*I_{REF}$ is lower than measured cell current ($I=K*I_{CELL}$).

Figure 7A:
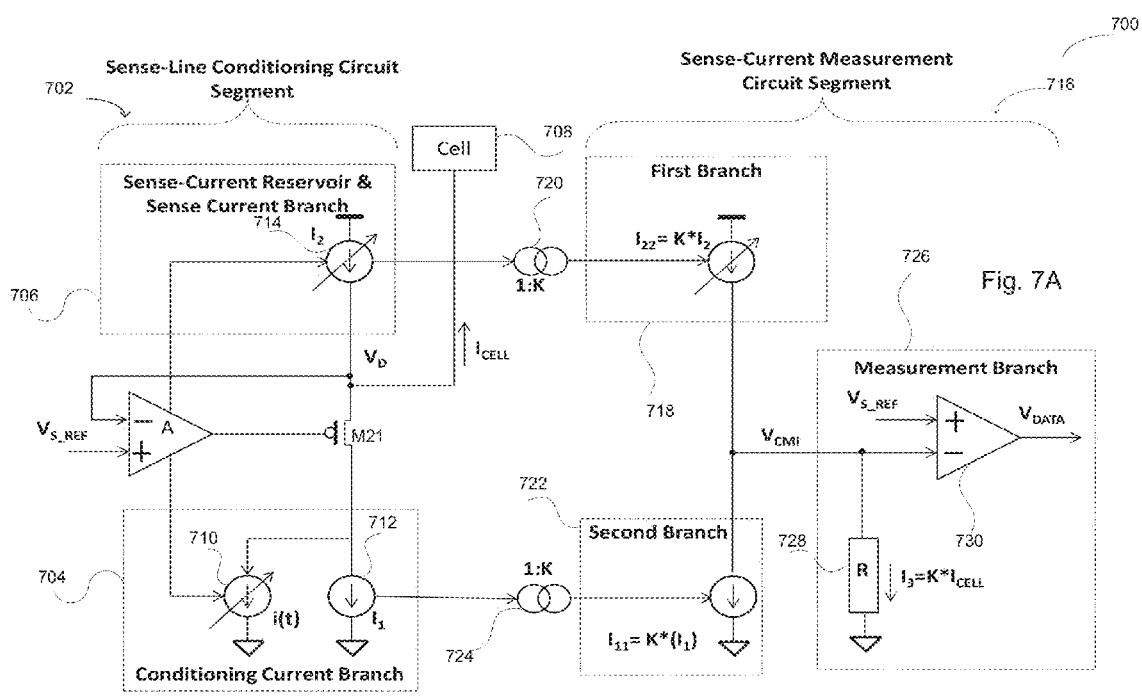

Turning now to FIG. 7A depicted is a composite functional block and circuit diagrams of NVM cell current sensing circuits 700 operative according to example drain-side sensing embodiments of the present invention. NVM cell current sensing circuits 700 may include a sense line conditioning circuit segment 702 which may include a conditioning current branch 704 and a sense current reservoir and sense current branch 706 and more.

According to some embodiments, sense line conditioning circuit segment 702 may be adapted to adjust a charge density, by increasing or decreasing charge, within a sense-line or sense-side-line connected to an NVM cell 708 whose threshold voltage (Vt) is to be sensed. Accordingly, a junction of the conditioning circuit segment 702 may be connected through an electrical switch (e.g. Y-MUX) to the sense-side-line of NVM cell 708 to be sensed. Conditioning circuit segment 702 may perform discharging of the sense-side-line by pulling current from the sense-side-line.

According to some embodiments, either before or concurrent with a sensing current being induced through NVM cell 708, sense-line conditioning circuit segment 702 may condition the sense-side line for sensing by adjusting the sense-side-line charge density of the NVM Cell, for example to or near a start-of-sensing-charge-density. Sense-side-line conditioning related charge density adjustment of the sense-side-line may be performed by conditioning circuit segment 702 which may induce current flow either into or out of the NVM cell sense-side-line. The direction of the conditioning current may be in a direction opposite to the NVM cell's sensing current. Shortly before or after NVM cell's 708 sensing current reaches a steady-state flow, level or value, conditioning circuit segment 702 may cease to adjust charge density within the sense-side-line. Shortly before or after NVM cell's 708 sensing current reaches a steady-state flow, level or value, the sense-line conditioning circuit segment may operate to maintain a sensing-condition for NVM cell sensing current to keep flowing. Maintaining a sensing-condition may include fixing and/or maintaining a voltage at a termination point of the sense-side-line of the NVM Cell such that voltages across various terminal sets of the NVM cell are maintained stable and the NVM cell sensing current is maintained at a steady state.

According to some embodiments, conditioning-current branch 704 may be adapted to either provide or drain conditioning current intended to adjust the charge density of a sense-side-line connected to NVM cell 708, where NVM cell 708 is intended to be sensed. Conditioning-current branch 704 may include one or more current sources, one of which may be a controllable or adjustable current source 710. According to some embodiments, during a first phase of sensing, when the sense-side-line of the NVM is being conditioned for sensing, current levels sunk by conditioning-current branch 704 may be greater than current levels sunk after the NVM cell 708 sensing current has reached a steady state.

According to some embodiments, during a first phase, current levels generated by conditioning current branch 704 may be either static or dynamic. After the sensing current has reached a steady state, the current levels generated by conditioning current branch 710 may be substantially static or substantially fixed as depicted by biasing current source 712. The substantially static or substantially fixed current produced by conditioning current branch 704, via biasing current source 712, at steady state may be termed a condition sustaining current or a biasing current. The condition sustaining current or biasing current (herein after collectively "biasing current") may serve to fix or maintain a voltage level at a point of the sense-side-line, for example at the termination point $V_s$. The biasing current, for example, may bias a field effect transistor M21 of the sense-line conditioning circuit segment, which transistor M21 may have: (1) a source terminal connected to the sense-line termination point $V_s$, and (2) a gate terminal connected to a fixed voltage point—thereby substantially fixing the voltage at the sense-side-line termination point. According to such embodiments, the transistor M21 may be termed a voltage anchor which voltage anchor assists in maintaining conditions for steady state sensing current flow.

According to some embodiments, NVM cell sense-line conditioning circuit segment 702 may include a sense-current-reservoir 706 adapted to provide/receive NVM cell's 708 sensing current. Sense current reservoir 706 may include a sense current branch through which substantially all of an NVM COWS sensing current, along with other currents such as a biasing current, may flow. According to some drain-side sensing embodiments, the sense-current-reservoir branch may include current source 714 from which sensing current to NVM cell 708 being sensed may be sourced.

According to embodiments, reservoir current source 714 may be controllable or adjustable. For example, during the first phase of sensing, while conditioning of the sense-side-line is being performed, reservoir source 714 may be caused to pinch (i.e. reduce or substantially block) current flow through the reservoir. During the second phase, while NVM cell current is in steady state, reservoir source 714 may be released such that the amount of current flowing through reservoir source 714 is substantially a function of (e.g. the sum), or dictated by: (1) the NVM cell 708 sensing current, and (2) biasing current produced by conditioning current branch 704.

NVM cell sensing circuit 700 may also include sense-current-measurement circuit segment 716 including first branch 718 which may be at least partially coupled, via current mirroring arrangement 720, with at least sense current branch 706 (e.g. reservoir source 714). According to further embodiments, second branch 720 of sense-current-measurement circuit segment 716 may be at least partially coupled, via current mirroring arrangement 724, to conditioning-current branch 704 of sense-line conditioning circuit segment 702. Sense-current-measurement circuit segment 716 may also include measurement branch 726 connected to an interconnect junction between first and second branches (718 and 722), such that a current induced to flow through measurement branch 726 is substantially equal to a difference between the current flowing through first branch 718 and the current flowing through second branch 722.

According to embodiments, sense-current-measurement circuit segment 716 may be referenced or utilized during a second sensing stage, once the NVM cell 708 sensing current has reached a steady state and conditioning current branch 704 is only generating a biasing current. At this, example, second sensing stage, since the current flowing through first branch 718 may be directly related to the current flowing through sense current reservoir sense branch current branch 706 (i.e. the sum of the NVM cell 708 sensing current and the biasing current), and the current flowing through second branch 722 is directly related to the current flowing through conditioning current branch 704 (i.e. the biasing current), the current induced in measurement branch 726 may be directly related to, some ratio (e.g. 1:1) of, the NVM Cell 708 sensing current at steady state. With knowledge of the respective ratios of the current mirroring arrangements relating to first and second branches (718 and 722), a ratio between the NVM cell 708 current and measurement branch 726 current is derivable. According to the simplest embodiments, both current mirror ratios are 1:1 and the measurement branch current will be substantially equal to the NVM cell 708 current. Therefore, by measuring current flowing through measurement branch 726, via direct measurement or indirect measurement (e.g. through load 728), an estimate of a current flowing through NVM cell 708 may be provided. During operation of NVM cell sensing circuit 700, once the NVM sense current has reached or is approaching steady state, a Vt and thus a logical state of NVM cell 708 may be determined or estimated by comparing measurement branch 726 current against one or more reference currents or voltages (such as $V_{s\_ref}$). For the purpose of carrying out the discussed comparison a comparator 730 may be used.

Turning now to FIG. 7B depicted is a composite functional block and circuit diagrams of NVM cell current sensing circuits 750 operative according to example drain-side sensing embodiments of the present invention. It is understood that NVM cell sensing circuits 750 is substantially similar to NVM cell sensing circuits 700 and that elements 752-776 are substantially similar to elements 702-726 of FIG. 7A. With regard to measurement branch 776, depicted is measuring current flowing through measurement branch 776, via direct measurement so that an estimate of a current flowing through NVM cell 758 may be provided as discussed with regard to FIG. 6B.

Figure 5:
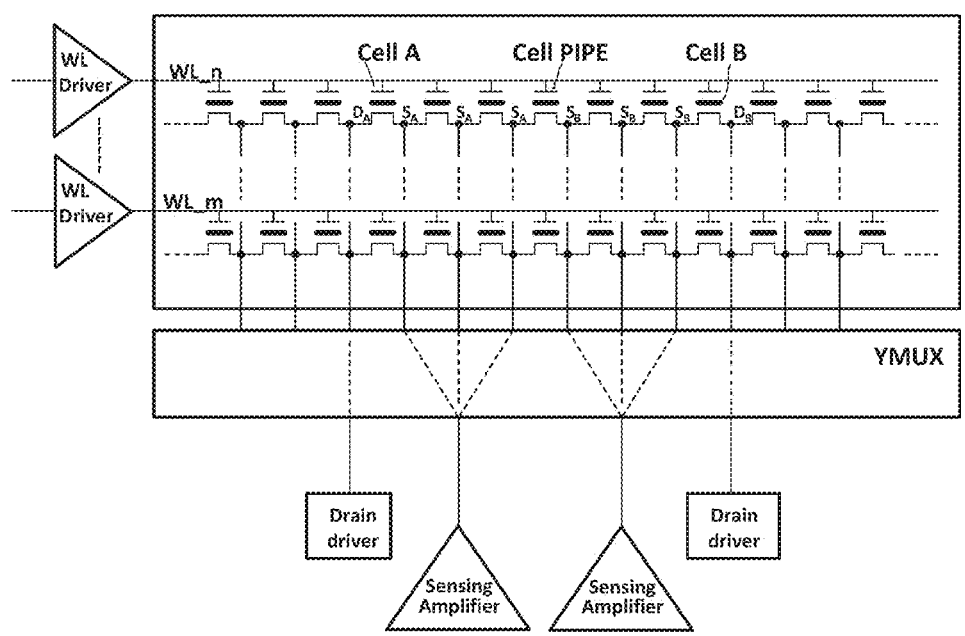
FIG. 5 shows a composite circuit and current flow diagram depicting how applied voltages and currents on lines of an NVM array may induce: (1) current flow through an Individually selected NVM cell, and (2) lateral or pipe current through several NVM cells adjacent to the selected cell.
Figure 8A:
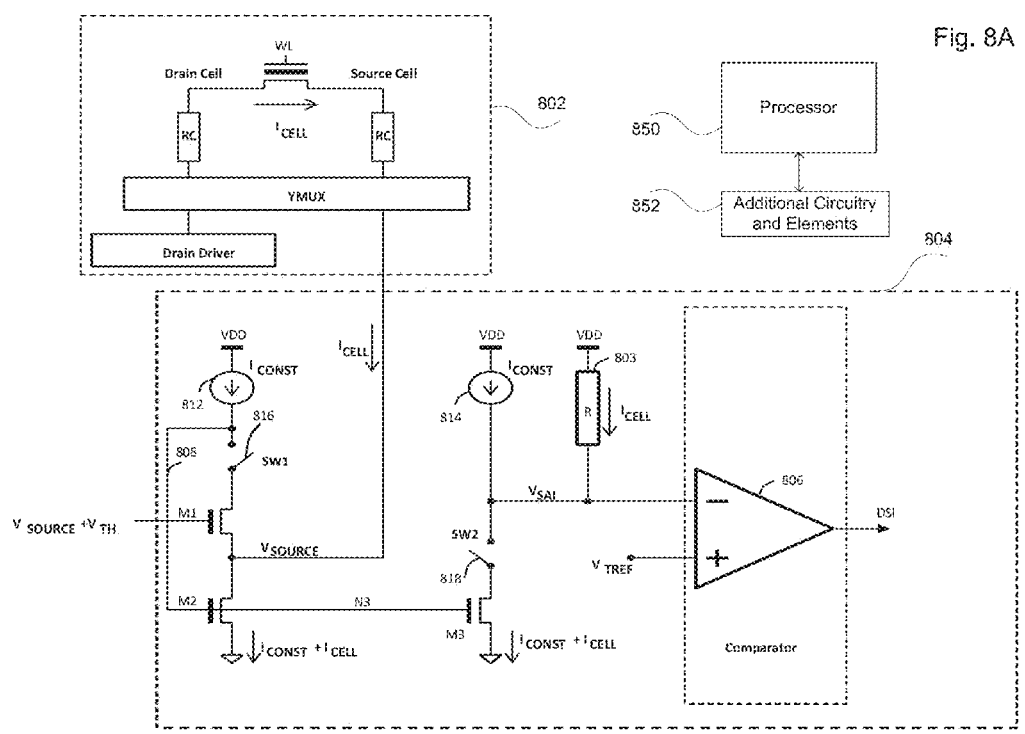
FIG. 8A is a composite circuit diagram and functional block diagram depiction of an exemplary sense amplifier electrically coupled to an NVM memory structure with an NVM cell and a processor and additional circuitry according to some embodiments of the present invention.

Turning now to FIG. 8A, depicted is a functional block diagram of an example system including memory array and peripheral circuitry a processor and additional circuitry 800. Memory array and peripheral 800 may include memory structure 802 which is concurrent with known memory structure configurations an example of which was discussed with regard to FIG. 5. Memory array and peripheral circuitry 800 may further include sense amplifier 804. Sense amplifier 804 may include a feedback loop and may generate or provide a voltage to a memory cell source side ($V_{SOURCE}$) and may receive or detect a flash memory cell current ($I_{CELL}$). Vsource may be determined or provided by $V_{in}$ for example if $V_{SOURCE}=V_{in}-V_{TH}$ where $V_{TH}$ is a threshold voltage of a transistor.

Feedback loop 808 may be configured to stabilize $V_{SOURCE}$ or keep $V_{source}$ at a stable condition. For example, if $V_{SOURCE}$ goes even slightly higher than its stabilized condition, feedback loop 808 may cause $V_{SOURCE}$ to discharge back to its stabilized position. In another example, if $V_{SOURCE}$ goes lower than its stabilized level, feedback loop 208 may cause $V_{SOURCE}$ to be charged back to its stabilized position.

Sense amp 804 may include current source 812 and current source 814. Current sources 812 and 814 may be substantially identical or a function or have a fixed, known or predetermined relationship between them so that the mirroring node N3 may cause a current substantially equal or having a known relationship or ratio to $I_{cell}$ to flow through the voltage generating stage (resistor R) 803 and accordingly determine output voltage $V_{SA}$.

According to some embodiments, switches may be utilized to enable, disable and time operation of sense amplifier 804. For example switch 816 and switch 818 may be utilized the example operation of switches may be understood from the discussion regarding FIG. 8B.

According to some embodiments, sense amplifier 804 may include comparator 806 to receive a first voltage associated with a selected memory cell voltage and a reference voltage to determine the state of the selected memory cell. The reference voltage may be received from a reference cell or otherwise. Some examples of memory cell states are (erased, native, programmed and more as well as multi-level programming for multiple-bit cells).

According to some embodiments, VDD is a supply voltage for sense amplifier 804. Sense amplifier 804 may be configured so that the minimal operative voltage (meaning, the minimal VDD voltage that allows accurate or correct operation of sense amplifier 804) is low (a typical range may be 700 mV-1V). Accordingly, the described sense amplifier block may be utilized in future technologies (for which a lower VDD is expected). Furthermore, VDD is understood to be independent of the both/either the VREF and VSOURCE values, thus allowing to achieve relatively high VSOURCE values (for example up to approximately VTH) without affecting the required supply voltage which may be advantageous in Erase Verify operations for example, to eliminate column leakage.

According to some embodiments, feedback loop 808 may be configured to have fast loop stabilization for example, by using a minimal amount of transistors and nodes within the loop. Accordingly, a higher gain of the sense amplifier 804 may also be achieved.

According to some embodiments, stabilization of feedback bop 808 may be independent of the memory cell current ($I_{CELL}$) which may improve the sensing speed compared to a sense amplifier that does not include a feedback bop independent of the memory cell.

According to some embodiments, sense amplifier 804 may be characterized by a low random offset, for example, in this embodiment, only transistor M1 inserts random offset to the Vsource output voltage) as well as low output impedance (for example, this embodiment is characterized by a, low Vsource output voltage dependence vs input Icell current). Furthermore, these two characteristics may significantly reduce the pipe effect in Virtual Ground Array (VGA) architectures and in general provides good stability and a fast response time.

According to some embodiments, sense amplifier 804 may be designed to have high noise immunity. Furthermore, the low supply operation allows to have a buffered supply for sense amplifier 804 thus reducing the noise level seen by the sensing amplifier and accordingly, improving the immunity to noise of sense amplifier 804.

In this example, the voltage level $V_{SOURCE}$ may be determined by: $V_{REF}=V_{th,M1}-V_{DSAT,M1}$. The expression depends on the constant current 812, and is almost independent of the memory cell current ($I_{CELL}$) (only through second order drain effect). Thus $V_{SOURCE}$, may be practically insensitive to the memory cell current ($I_{CELL}$).

In this example, the output impedance sense amplifier 804 can be expressed as:

$$Rout = \frac{\frac{1}{Gm} \| Rcell}{A}$$

Where, Rcell is the memory cell path resistance, A is the open loop gain of sense amplifier 804. 1/Gm is low and thus the overall output impedance is low. This may further reduce the sensitivity to the memory cell current (Icell) and thus may significantly reduce the pipe effect in VGA architectures and in general may cause sense amplifier 804 to have a stable operation and fast response time.

According to some embodiments, sense amplifier 804 may be designed to have high noise immunity. Furthermore, the low supply operation allows to have a buffered supply for sense amplifier 804 thus reducing the noise level seen by the sensing amplifier and accordingly, improving the immunity to noise of sense amplifier 804. For example, the minimal operational $V_{DD}$ voltage for the Sensing amplifier 804 may be estimated as:

$$V_{DD\_MIN}=V_{TH\_M2}+V_{DSAT\_M2}+V_{DSAT}$$

By way of example only if $V_{TH\_M2}=500$ mV, $V_{DSAT}=150$ mV, $V_{DSAT\_M2}=150$ mV, then $V_{DD\_MIN}=800$ mV. Furthermore, $V_{DD\_MIN}$ may be independent of the $V_{REF}/V_{SOURCE}$ values, thus allowing achieving high $V_{SOURCE}$ values (up to $\sim V_{TH}$) without affecting the required supply voltage.

Note that $I_{cell}$ is shown in several places throughout FIG. 4-8A, it is understood that $I_{cell}$ may differ in these places (for example due to leakage) but is substantially the same or equal.

System 800 may further include a processor 850 configured to access array structure 802 and Sense amplifier 804 to obtain data stored thereon. The data stored in/on array structure 802 may include data, code, encrypted data and more. Processor 850 may be further configured to receive/and or relay information and or instructions from additional circuitry 852. Additional circuitry 852 may include some or all of the following elements and more: screens, keyboards, touchscreens, medical instruments circuitry and mechanics, robotic circuitry and devices, antennas, GPS, WIFI circuitry, accelerometer, video game processing circuitry, Bluetooth etc. Some examples of products and or applications that may include system 800 are personal computers, PDAs, digital audio players, digital cameras, mobile phones, synthesizers, video games, scientific instrumentation, industrial robotics, medical electronics, and more.

Figure 8B:
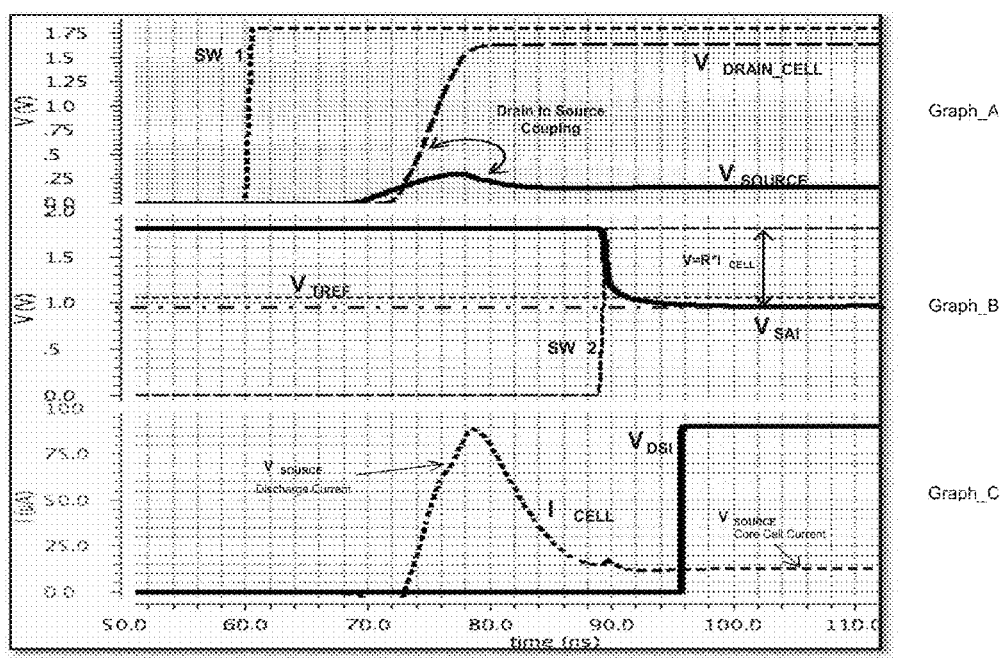
FIG. 8B, graphs A, B and C, are a group of voltage and current graphs showing exemplary voltage and current deviation at various nodes and across various elements of an NVM array and sense circuit as shown in FIG. 8A during an NVM cell sensing operation performed in accordance with an embodiment of the present invention.

Turning now to FIG. 8B, depicted are graphs A, B and C, which are a group of voltage and current graphs showing exemplary voltage and current deviation at various nodes and across various elements of an NVM array and sense circuit as shown in FIG. 8A during an NVM cell sensing operation performed in accordance with an embodiment of the present invention. While specific values are shown with regard to voltage and current, it is understood that different values are also understood and this is only one example where many different ranges are applicable. Furthermore, while for some signals specific operation has been selected, different timing, directions or operability are also possible within embodiments of the invention and other signals are dependent also on starting conditions (for example state or value stored within the memory cell) and may differ accordingly. Examples of location of nodes or signals discussed in this figure may be found in FIG. 8A.

According to some embodiments, graph_A may depict enablement of a first SW (SW1). Following enablement of SW1 the drain side of a memory cell may be charged ($V_{DRAIN\_CELL}$) in response to the drain side being charged the node $V_{source}$ may be charged and drain to source coupling effect and then stabilized due to a feedback loop may also be seen on graph_A.

According to some embodiments, turning to graph_B after SW2 is enabled, a comparator input voltage ($V_{SAI}$) is quickly stabilized at its memory cell dependent value. In this graph, $V_{TREF}$ is depicted at a specific voltage, however additional voltages can be shown. Graph_C then depicts that the memory cell current ($I_{cell}$) at $V_{Source}$ initially discharges the node and then stabilizes to the core cell current at $V_{SOURCE}$ (following enablement of SW2—see graph_B) and quickly afterwards comparator output value $V_{DSI}$ shows the result memory cell value compared to the reference cell $V_{TREF}$ of graph_B. If the memory cell current ($I_{CELL}$) was lower, or the $V_{TREF}$ voltage lower than the $V_{DSI}$ voltage may be grounded.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A non-volatile memory (NVM) cell sensing circuit comprising:
a sense-side-line conditioning circuit segment adapted to condition a sense-side-line of the NVM cell by adjusting a charge density within the NVM cell sense-side-line during a first NVM cell current sensing phase and further adapted to maintain an NVM cell current sensing condition during a second NVM cell current sensing phase, wherein adjusting a charge density within the NVM cell sense-side-line includes inducing current in the sense-side-line in a direction opposite to the sensing current.

2. The sensing circuit according to claim 1, wherein said sense-side-line conditioning circuit segment comprises a condition current branch adapted to generate a first current during the first sensing phase and a second current, smaller than the first current, during the second sensing phase.

3. The sensing circuit according to claim 2, wherein said conditioning current branch comprises one or more current sources when said sensing circuit is operating according to a source-side sensing arrangement.

4. The sensing circuit according to claim 2, wherein said conditioning current branch comprises one or more current sinks when said sensing circuit is operating according to a drain-side sensing arrangement.

5. The sensing circuit according to claim 1, wherein said sense-side-line conditioning circuit segment comprises a sense-current reservoir adapted to pinch off current flow during the first current sensing phase and to provide for substantially uninhibited flow of NVM cell current during the second current sensing phase.

6. The sensing circuit according to claim 5, wherein said current reservoir comprises a controllable current sink when said sensing circuit is operating according to a source-side sensing arrangement.

7. The sensing circuit according to claim 5, wherein said current reservoir comprises a controllable current source when said sensing circuit is operating according to a drain-side sensing arrangement.

8. The sensing circuit according to claim 1, further comprising a sense current measurement circuit adapted to induce within a constituent branch a current whose amplitude is directly related the NVM cell current.

9. The sensing circuit according to claim 8, wherein said sense current measurement circuit comprises two mirroring circuit branches, each of which is coupled in a current mirroring arrangement with a corresponding branch of said sense-side-line conditioning circuit segment.

10. A non-volatile memory (NVM) system comprising:
a non-volatile memory array including a set of NVM cells;
a sense-side-line conditioning circuit segment adapted to condition a sense-side-line of an NVM cell by adjusting a charge density within the NVM cell sense-side-line during a first NVM cell current sensing phase and further adapted to maintain an NVM cell current sensing condition during a second NVM cell current sensing phase, wherein adjusting a charge density within the NVM cell sense-side-line includes inducing current in the sense-side-line in a direction opposite to the sensing current; and
a processor configured to access said non-volatile memory array and read stored data.

11. The device according to claim 10, wherein said sense-side-line conditioning circuit segment comprises a condition current branch adapted to generate a first current during the first sensing phase and a second current, smaller than the first current, during the second sensing phase.

12. The device according to claim 11, wherein said conditioning current branch comprises one or more current sources when said sensing circuit is operating according to a source-side sensing arrangement.

13. The device according to claim 11, wherein said conditioning current branch comprises one or more current sinks when said sensing circuit is operating according to a drain-side sensing arrangement.

14. The device according to claim 10, wherein said sense-side-line conditioning circuit segment comprises a sense-current reservoir adapted to pinch off current flow during the first current sensing phase and to provide for substantially uninhibited flow of NVM cell current during the second current sensing phase.

15. The device according to claim 14, wherein said current reservoir comprises a controllable current sink when said sensing circuit is operating according to a source-side sensing arrangement.

16. The device according to claim 14, wherein said current reservoir comprises a controllable current source when said sensing circuit is operating according to a drain-side sensing arrangement.

17. The device according to claim 10, further comprising a sense current measurement circuit adapted to induce within a constituent branch a current whose amplitude is directly related the NVM cell current.

18. The device according to claim 17, wherein said sense current measurement circuit comprises two mirroring circuit branches, each of which is coupled in a current mirroring arrangement with a corresponding branch of said sense-side-line conditioning circuit segment.

19. A non-volatile memory (NVM) cell sensing method comprising:
conditioning a sense-side-line of the NVM cell by adjusting a charge density within the NVM cell sense-side-line during a first NVM cell current sensing phase;
maintaining an NVM cell current sensing condition during a second NVM cell current sensing phase; and
wherein adjusting a charge density within the NVM cell sense-side-line includes inducing current in the sense-side-line in a direction opposite to the sensing current.

20. The method according to claim 19, wherein said sense-side-line conditioning circuit segment comprises a condition current branch adapted to generate a first current during the first sensing phase and a second current, smaller than the first current, during the second sensing phase.

21. The method according to claim 20, wherein said conditioning current branch comprises one or more current sources when said sensing circuit is operating according to a source-side sensing arrangement.

22. The method according to claim 20, wherein said conditioning current branch comprises one or more current sinks when said sensing circuit is operating according to a drain-side sensing arrangement.

23. The method according to claim 19, wherein said sense-side-line conditioning circuit segment comprises a sense-current reservoir adapted to pinch off current flow during the first current sensing phase and to provide for substantially uninhibited flow of NVM cell current during the second current sensing phase.

24. The method according to claim 23, wherein said current reservoir comprises a controllable current sink when said sensing circuit is operating according to a source-side sensing arrangement.

25. The method according to claim 23, wherein said current reservoir comprises a controllable current source when said sensing circuit is operating according to a drain-side sensing arrangement.

26. The method according to claim 19, further comprising a sense current measurement circuit adapted to induce within a constituent branch a current whose amplitude is directly related the NVM cell current.

27. The method according to claim 26, wherein said sense current measurement circuit comprises two mirroring circuit branches, each of which is coupled in a current mirroring arrangement with a corresponding branch of said sense-side-line conditioning circuit segment.

* * * * *